(12) United States Patent
Wilson et al.

(10) Patent No.: US 7,292,439 B2
(45) Date of Patent: Nov. 6, 2007

(54) THERMAL MANAGEMENT SYSTEM AND METHOD FOR ELECTRONIC ASSEMBLIES

(75) Inventors: James S. Wilson, Hurst, TX (US); Michael A. Moore, Ft. Worth, TX (US)

(73) Assignee: Raytheon Company, Waltham, WA (US)

( * ) Notice: Subject to any disclaimer, the term of this patent is extended or adjusted under 35 U.S.C. 154(b) by 348 days.

(21) Appl. No.: 11/039,212

(22) Filed: Jan. 19, 2005

(65) Prior Publication Data

US 2006/0158855 A1    Jul. 20, 2006

(51) Int. Cl.
*H05K 7/20* (2006.01)

(52) U.S. Cl. ............... 361/700; 165/80.4; 165/104.33; 361/699; 361/702

(58) Field of Classification Search .............. 361/699, 361/700
See application file for complete search history.

(56) References Cited

U.S. PATENT DOCUMENTS

| | | | | |
|---|---|---|---|---|
| 4,138,692 A | * | 2/1979 | Meeker et al. | 257/697 |
| 4,951,740 A | * | 8/1990 | Peterson et al. | 165/276 |
| 5,198,889 A | * | 3/1993 | Hisano et al. | 257/678 |
| 5,206,791 A | * | 4/1993 | Novotny | 361/700 |
| 5,608,610 A | * | 3/1997 | Brzezinski | 361/704 |
| 6,918,437 B2 | * | 7/2005 | Eytcheson et al. | 165/185 |

* cited by examiner

*Primary Examiner*—Gregory D Thompson
(74) *Attorney, Agent, or Firm*—Baker Botts L.L.P.

(57) ABSTRACT

According to an embodiment of the present invention, a thermal management system for an electronic assembly includes an electronic component coupled to a substrate, the substrate coupled to a coldplate, a spring member disposed between and engaging both the electronic component and the coldplate, and a heat transfer element disposed within a chamber formed by the spring member.

20 Claims, 1 Drawing Sheet

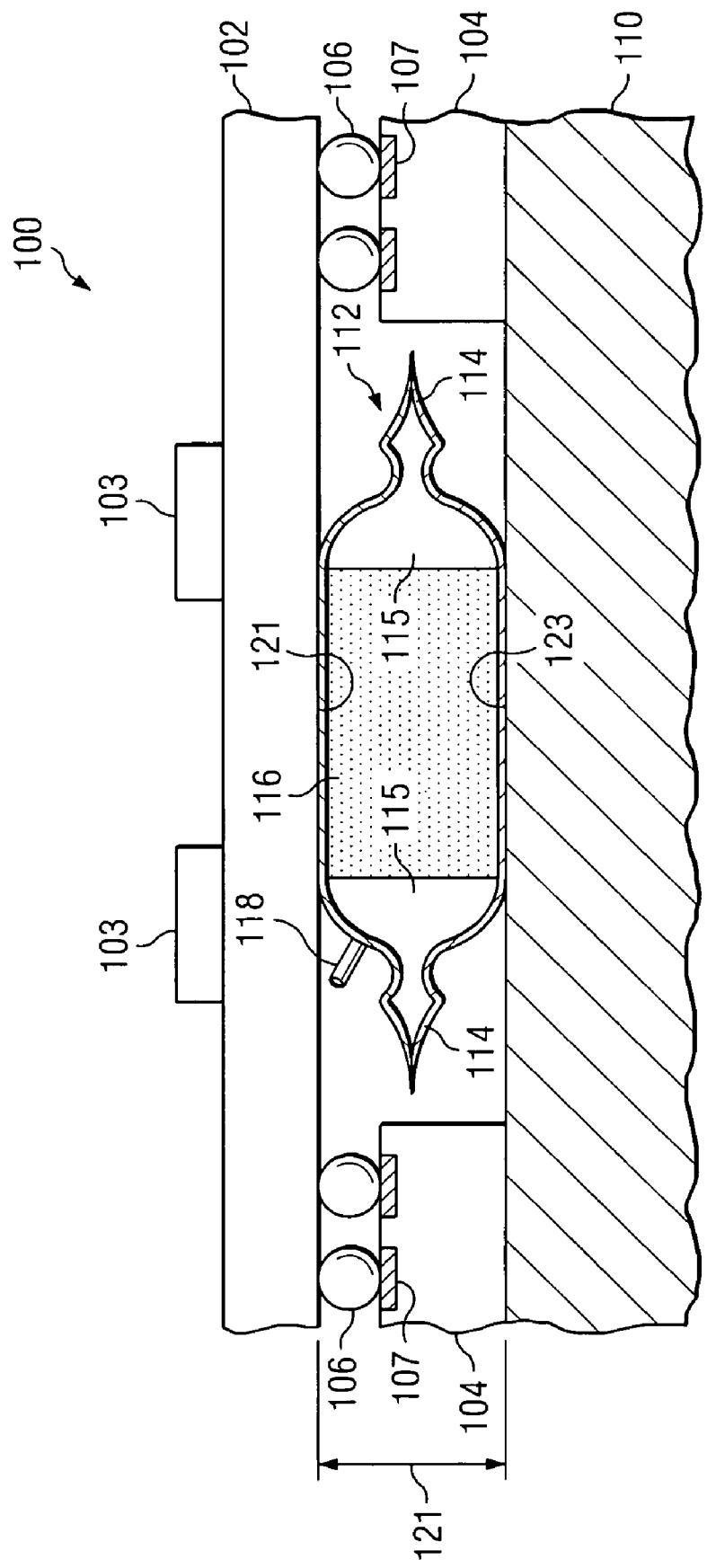

THERMAL MANAGEMENT SYSTEM AND METHOD FOR ELECTRONIC ASSEMBLIES

TECHNICAL FIELD OF THE INVENTION

This invention relates in general to thermal management of electronic assemblies and, more particularly, to a thermal management system and method for integrated circuit packages coupled to circuit boards.

BACKGROUND OF THE INVENTION

Attachment of integrated circuit packages, such as ball grid arrays ("BGAs"), to circuit boards may require careful thermal considerations. For example, attachment of a tile-based transmit/receive ("TR") module for a phased array radar to a circuit board with a BGA approach requires that the thermal interface not interfere with the ball attachment. The thermal interface should be of sufficient flexibility so that it does not cause a separation between the TR module and the circuit board by placing sufficient stress on the solder balls.

Merely having an air interface is not sufficient because the low thermal conductivity of air is not sufficient for heat transfer. Placing solid materials between the integrated circuit packages and circuit boards could meet thermal conductivity requirements, but it would be impractical because of the tolerances involved. Compliant materials placed in the gap would possible mitigate thermal stress concerns on the solder balls, but compliant materials with high thermal conductivity are not available.

SUMMARY OF THE INVENTION

According to an embodiment of the present invention, a thermal management system for an electronic assembly includes an electronic component coupled to a substrate, the substrate coupled to a coldplate, a spring member disposed between and engaging both the electronic component and the coldplate, and a heat transfer element disposed within a chamber formed by the spring member.

Embodiments of the invention provide a number of technical advantages. Embodiments of the invention may include all, some, or none of these advantages. For example, in one embodiment, the use of a spring-like assembly to keep the top and bottom surfaces in contact with an integrated circuit package base and coldplate, respectively, allows adequate thermal coupling and structural integrity. Such assembly causes good thermal contact to remain in spite of dimension changes that occur as a result of operation over temperature extremes. This assembly may be combined with a concept similar to that of heat pipes to facilitate two-phase heat transfer.

Other technical advantages are readily apparent to one skilled in the art from the following FIGURE, descriptions, and claims.

BRIEF DESCRIPTION OF THE DRAWINGS

FIG. 1 is a cross-sectional elevation view illustrating a thermal management system for an integrated circuit package coupled to a circuit board in accordance with an embodiment of the invention.

DETAILED DESCRIPTION OF THE INVENTION

Embodiments of the present invention and some of their advantages are best understood by referring to FIG. 1, like numerals being used for like and corresponding parts of the various drawings.

FIG. 1 is a cross-sectional elevation view illustrating a thermal management system 100 for an integrated circuit package 102 coupled to a circuit board 104 in accordance with an embodiment of the invention. In the illustrated embodiment, integrated circuit package 102 is represented as a ball grid array ("BGA") that is coupled to circuit board 104 by a plurality of solder balls 106 coupled to respective contact pads 107 formed in circuit board 104. However, the present invention contemplates other suitable integrated circuit packages or electronic components coupled to any suitable substrate in any suitable manner. For example, the electronic assembly may be a space-based antenna, and the integrated circuit package 102 may have any suitable number and type of heat-generating components, such as integrated circuits 103, coupled to a surface thereof.

Depending on the application for system 100, effective heat dissipation from integrated circuit package 102 may be important. Therefore, according to the teachings of one embodiment of the invention, system 100 includes a heat transfer assembly 112 disposed between and engaging both integrated circuit package 102 and a coldplate 110. Coldplate 110 may also be coupled to circuit board 104 and may have any suitable size and shape and may be formed for any suitable material, such as a suitable metal. In addition, coldplate 110 may be formed from one or more layers.

Heat transfer assembly 112 transfers heat generated by integrated circuit package 102 to coldplate 110. In the illustrated embodiment, heat transfer assembly 112 includes a spring member 114 and a heat transfer element 116 disposed within a chamber 115 defined by spring member 114. Heat transfer assembly 112 may also include a fill port 118. In order to obtain effective heat transfer from integrated circuit package 102 to coldplate 110, a top portion 121 of spring member 114 remains engaged with integrated circuit package 102 and a bottom portion 123 of spring member 114 remains engaged with coldplate 110 during operation of system 100. Thus, spring member 114 is configured to allow top portion 121 to exert a force against integrated circuit package 102 and bottom portion 123 to exert a force against coldplate 110 during operation of system 100. In one embodiment, a distance 121 between integrated circuit package 102 and coldplate 110 is no more than approximately 0.25 inch.

In the illustrated embodiment, spring member 114 is formed from two separate sheets of material that are coupled at their respective ends in any suitable manner, such as mechanical bonding. Spring member 114 may be formed from any suitable material, such as a suitable metal and may have any suitable size and shape to facilitate the continuous engagement of top portion 121 with integrated circuit package 102 and bottom portion 123 with coldplate 110. Thus, one advantage of the compliant nature of spring member 114 is that it allows heat transfer assembly 112 to operate over temperature extremes and to tolerate manufacturing tolerances.

Heat transfer element 116 may include any suitable element that functions to transfer heat from top portion 121 to bottom portion 123 of spring member 114. Heat transfer element 116 may couple to and/or engage both top portion 121 and bottom portion 123 in any suitable manner. It is preferable that heat transfer element 116 stay in contact with both top portion 121 and bottom portion 123. Thus, in one embodiment, heat transfer element 116 may be placed in compression during insertion into chamber 115 of spring member 114 so that the top and bottom surfaces of heat transfer element 116 stay in contact therewith.

In the illustrated embodiment, heat transfer element 116 includes a suitable wicking material, such as a wire mesh formed from any suitable material that functions similar to a heat pipe. As such, in one embodiment, a fluid is disposed in chamber 115 at any suitable pressure so that evaporation of the fluid (i.e. heat removal) occurs at the interface of top portion 121 and heat transfer element 116 and condensation of fluid appears at the interface of bottom portion 123 and coldplate 110. This evaporation and condensation of fluid at the respective locations is continuous throughout operation of system 100 in order to effectively remove heat from integrated circuit package 102 and deliver it to coldplate 110. Any suitable fluid is contemplated by the present invention, such as water, acetone, methanol, or other suitable fluid.

Thus, during operation of one embodiment of the invention, heat transfer assembly 112 facilitates effective heat transfer from integrated circuit package 102 to coldplate 110 by keeping top portion 121 in contact with integrated circuit package 102 and bottom portion 123 in contact with coldplate 110 while preventing excessive stress from occurring at the solder balls 106/contact pads 107 interface by relieving those contact areas of having to perform a majority of the heat transfer from integrated circuit package 102 to coldplate 110.

Although embodiments of the invention and some of their advantages are described in detail, a person skilled in the art could make various alterations, additions, and omissions without departing from the spirit and scope of the present invention as defined by the appended claims.

What is claimed is:

1. A thermal management system for an electronic assembly, comprising:
    an electronic component coupled to a substrate;
    the substrate coupled to a coldplate;
    a spring member disposed between and engaging both the electronic component and the coldplate, the spring member comprising a pair of thin metal sheets coupled at their respective ends; and
    a heat transfer element disposed within a chamber formed by the spring member.

2. The system of claim 1, wherein the electronic component comprises a ball grid array.

3. The system of claim 1, wherein the electronic assembly comprises a space-based antenna.

4. The system of claim 1, wherein the substrate comprises a circuit board.

5. The system of claim 1, wherein the heat transfer element comprises a wicking material.

6. The system of claim 1, further comprising a fill port coupled to the chamber for delivering a fluid into the chamber.

7. The system of claim 1, wherein a distance between the electronic component and the coldplate is no more than approximately 0.25 inch.

8. A thermal management method for an electronic assembly, comprising:
    coupling an electronic component to a substrate;
    coupling the substrate to a coldplate;
    disposing a spring member between the electronic component and the coldplate such that the spring member engages both the electronic component and the coldplate, the spring member comprising a pair of thin metal sheets coupled at their respective ends; and
    disposing a heat transfer element within a chamber formed by the spring member.

9. The method of claim 8, wherein the electronic component comprises a ball grid array.

10. The method of claim 8, wherein the electronic assembly comprises a space-based antenna.

11. The method of claim 8, wherein coupling the electronic component to the substrate comprises coupling the electronic component to a circuit board.

12. The method of claim 8, wherein the heat transfer element comprises a wicking material.

13. The method of claim 8, further comprising coupling a fill port to the chamber and delivering a fluid into the chamber.

14. The method of claim 8, wherein a distance between the electronic component and the coldplate is no more than approximately 0.25 inch.

15. A thermal management system for an electronic assembly, comprising:
    an integrated circuit coupled to a circuit board;
    the circuit board coupled to a coldplate;
    a spring member disposed between and engaging both the integrated circuit and the coldplate;
    a wicking material disposed within a chamber formed by the spring member;
    a fluid disposed within the chamber;
    wherein a first surface of the spring member applies a first force to the integrated circuit and a second surface of the spring member applies a second force to the coldplate such that the first surface remains engaged with the integrated circuit and the second surface remains engaged with the coldplate during operation of the electronic assembly; and
    a fill port coupled to the chamber for delivering the fluid into the chamber.

16. The system of claim 15, wherein the spring member comprises a pair of thin metal sheets coupled at their respective ends.

17. The system of claim 15, wherein the wicking material comprises a wire mesh.

18. A thermal management system for an electronic assembly, comprising:
    an electronic component coupled to a substrate;
    the substrate coupled to a coldplate;
    a spring member disposed between and engaging both the electronic component and the coldplate;
    a heat transfer element disposed within a chamber formed by the spring member; and
    a fill port coupled to the chamber for delivering a fluid into the chamber.

19. A thermal management method for an electronic assembly, comprising:
    coupling an electronic component to a substrate;
    coupling the substrate to a coldplate;
    disposing a spring member between the electronic component and the coldplate such that the spring member engages both the electronic component and the coldplate;
    disposing a heat transfer element within a chamber formed by the spring member; and
    coupling a fill port to the chamber and delivering a fluid into the chamber.

20. A thermal management system for an electronic assembly, comprising:
    an integrated circuit coupled to a circuit board;
    the circuit board coupled to a coldplate;
    a spring member disposed between and engaging both the integrated circuit and the coldplate, the spring member comprising a pair of thin metal sheets coupled at their respective ends;

a wicking material disposed within a chamber formed by the spring member;

a fluid disposed within the chamber; and wherein a first surface of the spring member applies a first force to the integrated circuit and a second surface of the spring member applies a second force to the coldplate such that the first surface remains engaged with the integrated circuit and the second surface remains engaged with the coldplate during operation of the electronic assembly.

\* \* \* \* \*